US 6,717,831 B2

(12) United States Patent
Rhee et al.

(10) Patent No.: US 6,717,831 B2
(45) Date of Patent: Apr. 6, 2004

(54) CONTENT ADDRESSABLE MEMORY DEVICE

(75) Inventors: Young-Chul Rhee, Suwon (KR); Young-Tak Han, Kunpo-shi (KR); Kwang-Ju Lee, Seoul (KR); Jung-Ryul Pyo, Suwon (KR); Jong-ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/153,391

(22) Filed: May 22, 2002

(65) Prior Publication Data

US 2003/0072171 A1 Apr. 17, 2003

(30) Foreign Application Priority Data

Oct. 12, 2001 (KR) ........................................ 2001-62847

(51) Int. Cl.[7] .............................................. G11C 15/00
(52) U.S. Cl. ........................................ 365/49; 365/221
(58) Field of Search ........................... 365/49, 221, 196

(56) References Cited

U.S. PATENT DOCUMENTS

| 5,396,449 A | * | 3/1995 | Atallah et al. ................. 365/49 |
| 5,422,838 A | * | 6/1995 | Lin .............................. 365/49 |
| 5,491,703 A | * | 2/1996 | Barnaby et al. ............. 371/40.1 |
| 5,940,852 A | * | 8/1999 | Rangasayee et al. ........ 711/108 |
| 6,373,739 B1 | | 4/2002 | Lien et al. ..................... 365/49 |
| 6,515,884 B1 | * | 2/2003 | Sywyk et al. ................. 365/49 |

FOREIGN PATENT DOCUMENTS

| GB | 2277616 | 11/1994 | ........... G11C/15/04 |
| WO | WO 00/60604 | 10/2000 | ........... G11C/15/04 |

OTHER PUBLICATIONS

U.S. patent application Publication No. 2001/0026464 A1, date of publication: Oct. 4, 2001, "Content Addressable Memory with Potentials of Search Bit Line and/or Match Line set as Intermediate Potential Between Power Source Potential and Ground Potential".

* cited by examiner

Primary Examiner—M. Tran
(74) Attorney, Agent, or Firm—F. Chau & Associates LLC (57) ABSTRACT

A content addressable memory (CAM) device providing higher integration density, high operation speed and low power consumption. The CAM device comprises a memory cell connected between first and second nodes, first and second data lines for transmitting first and second data signals to the first and second nodes, respectively, and first and second switching devices serially connected between a match line and a reference voltage, wherein the first switching device is controlled by the first data signal and a voltage of the first node and the second switching device is controlled by the second data signal and a voltage of the second node.

20 Claims, 7 Drawing Sheets

Fig. 1

(Prior Art)

Fig. 2

(Prior Art)

Fig. 3

(Prior Art)

ID memory device having improved integration density and
CONTENT ADDRESSABLE MEMORY DEVICE

CROSS-REFERENCE TO RELATED APPLICATION

This application claims priority to Korean Patent Application No. 2001-62847, filed on Oct. 12, 2001.

BACKGROUND

1. Technical Field

The present invention relates to a semiconductor integrated circuit, and more particularly to a content addressable memory device having improved integration density and speed.

2. Description of Related Art

A content addressable memory (CAM) is a memory device comprising a plurality of CAM cells for storing data. A CAM memory is commonly used as a tag memory for storing addresses of a cache memory when high speed operation is needed. A CAM cell comprises a static random access memory (SRAM) and a comparing circuit, and is connected to a match line. The comparing circuit of the CAM cell compares the data stored in the SRAM with the data inputted through bit lines, and outputs a match signal to the match line when the compared data is similar.

More specifically, a typical CAM array comprises CAM cells arranged in a matrix format comprising rows and columns. The CAM cells on one row are connected to a match line, and the CAM cells on one column are connected to bit lines. Each CAM cell in the CAM cell array compares the data stored therein with the data inputted through the bit lines corresponding to the CAM cell. If the compared data is different, the CAM cell discharges the match line. The discharged voltage level of the match line indicates that a mismatch exists in a column of the CAM array. The mismatch in the column of the CAM array may be indicated by any one CAM cell connected to the column by discharging a corresponding match line.

Figure 1:
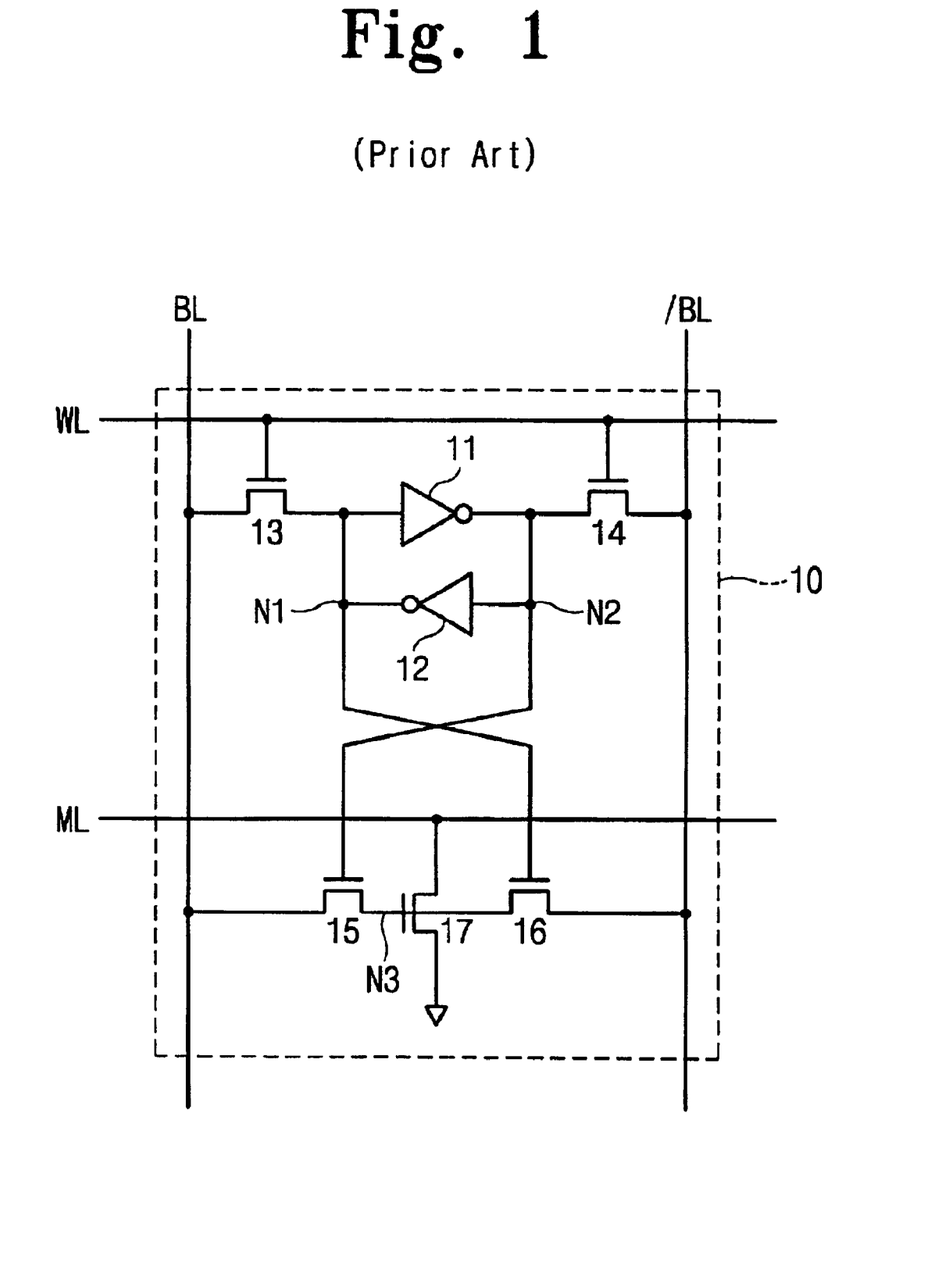
FIGS. 1~3 are diagrams showing conventional CAM cells.

FIG. 1 illustrates an exemplary CAM cell 10 disclosed in Korean Patent. No. 2000-250807 entitled "A field configurable RAM and programmable logic array memory using a CAM cell structure and a CAM cell" issued to Lee Gui-ro et al. The CAM cell 10 comprises an SRAM having inverters 11 and 12 and N channel metallic oxide semiconductor (NMOS) transistors 13 and 14, and a comparing circuit having NMOS transistors 15, 16 and 17.

The NMOS transistors 15 and 16 have current paths formed in series between bit lines BL, /BL, and gates connected to nodes N1 and N2, respectively. The NMOS transistor 17 has a gate connected to connection node N3 of the NMOS transistors 15 and 16 and to a current path formed between a match line ML and a ground voltage.

If the data input to bit lines BL, /BL is identical with the data stored in the SRAM, a pre-charged state of the match line ML is maintained. However, if the data input to bit lines BL, /BL is different from the data stored in the SRAM cell, the level of node N3 becomes high by the NMOS transistor 15 or 16. As a result, the NMOS transistor 17 is turned on to discharge the pre-charged match line ML.

The CAM cell 10 has a superior integration density because only three transistors construct the comparing circuit. One disadvantage of the CAM cell 10 is that the NMOS transistor 17 operates at slow speed because the power source voltage level of the data inputted through the bit line BL or /BL to the NMOS transistor 17 is lowered by a threshold voltage Vth of the NMOS transistor 15 or the NMOS transistor 16.

Figure 2:
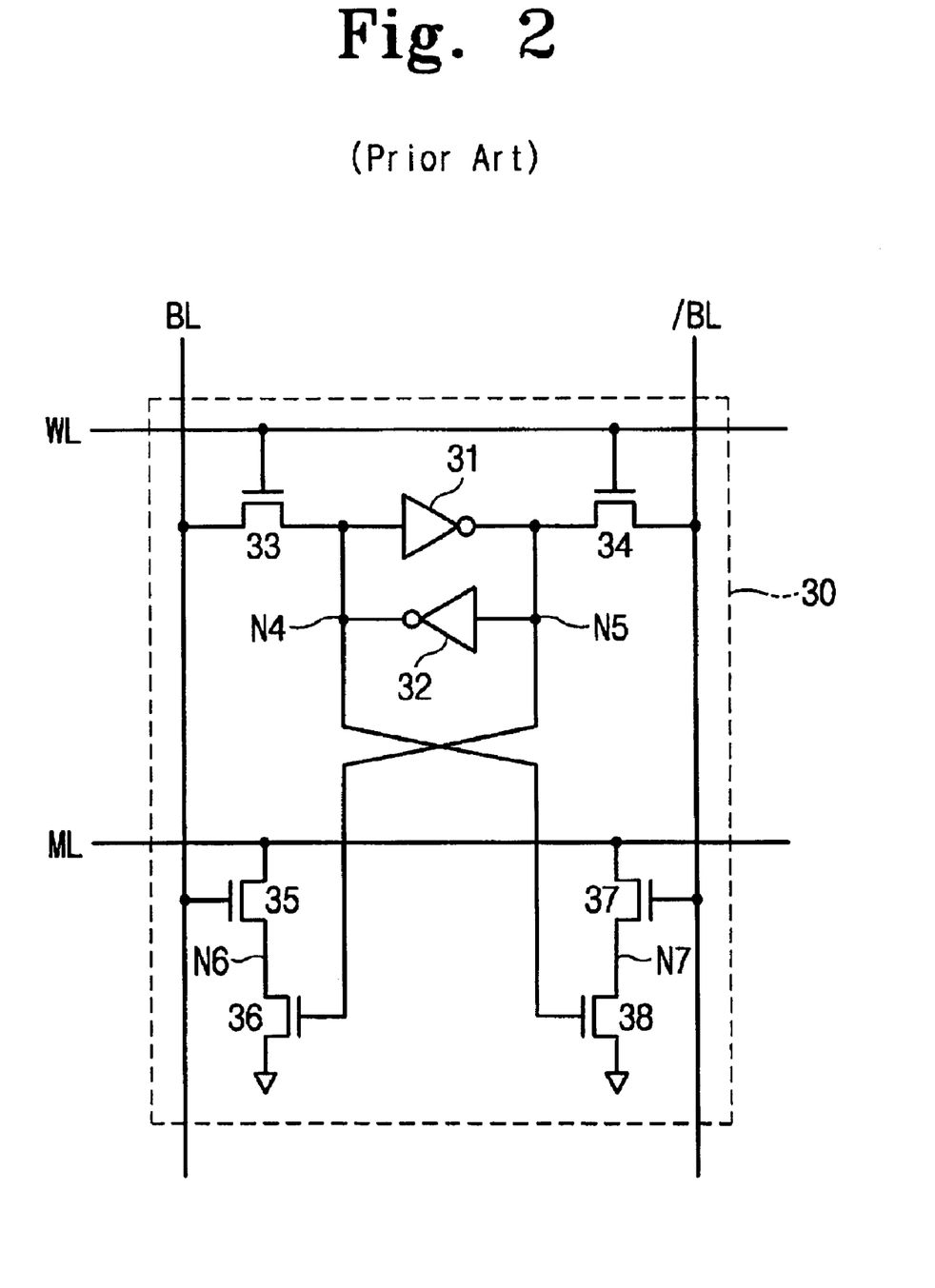

FIG. 2 illustrates another exemplary CAM cell 30 disclosed in U.S. Pat. No. 5,396,449 entitled "Fast content addressable memory with reduced power consumption" issued in 1995 to Francois et al. The CAM cell 30 comprises a SRAM cell having inverters 31, 32 and NMOS transistors 33, 34, and a comparing circuit having NMOS transistors 35, 36, 37 and 38.

The NMOS transistors 35, 36 have current paths formed sequentially in series between a match line and a ground voltage, and gates connected to a bit line BL and a node N5, respectively. The NMOS transistors 37, 38 have current paths formed sequentially in series between a match line and a ground voltage, and gates connected to a bit line /BL and node N4, respectively. The bit lines BL, /BL transmit complementary data to the CAM cell 30, respectively.

If the data input to bit lines BL, /BL is identical with the data stored in the SRAM cell, a pre-charged state of the match line ML is maintained. On the contrary, if the data is different from each other, the match line ML is discharged to a ground voltage by the transistors 35 and 36 or 37 and 38, which are serially connected to each other.

The CAM cell 30 has a superior integration density because all of the transistors constructing the comparing circuit are NMOS transistors, and the CAM cell 30 operates at a low power because only gates of transistors 35, 36, 37, and 38 are operated. But, the CAM cell 30 of FIG. 2 has a greater size than the CAM cell 10 of FIG. 1, because the CAM cell 30 has four transistors 35, 36, 37 and 38 to form two current paths for discharging the match line ML while the CAM cell 10 of FIG. 1 has only one transistor 17 to discharge the match line ML. Thus, the CAM cell 30 has increased circuit area.

Figure 3:
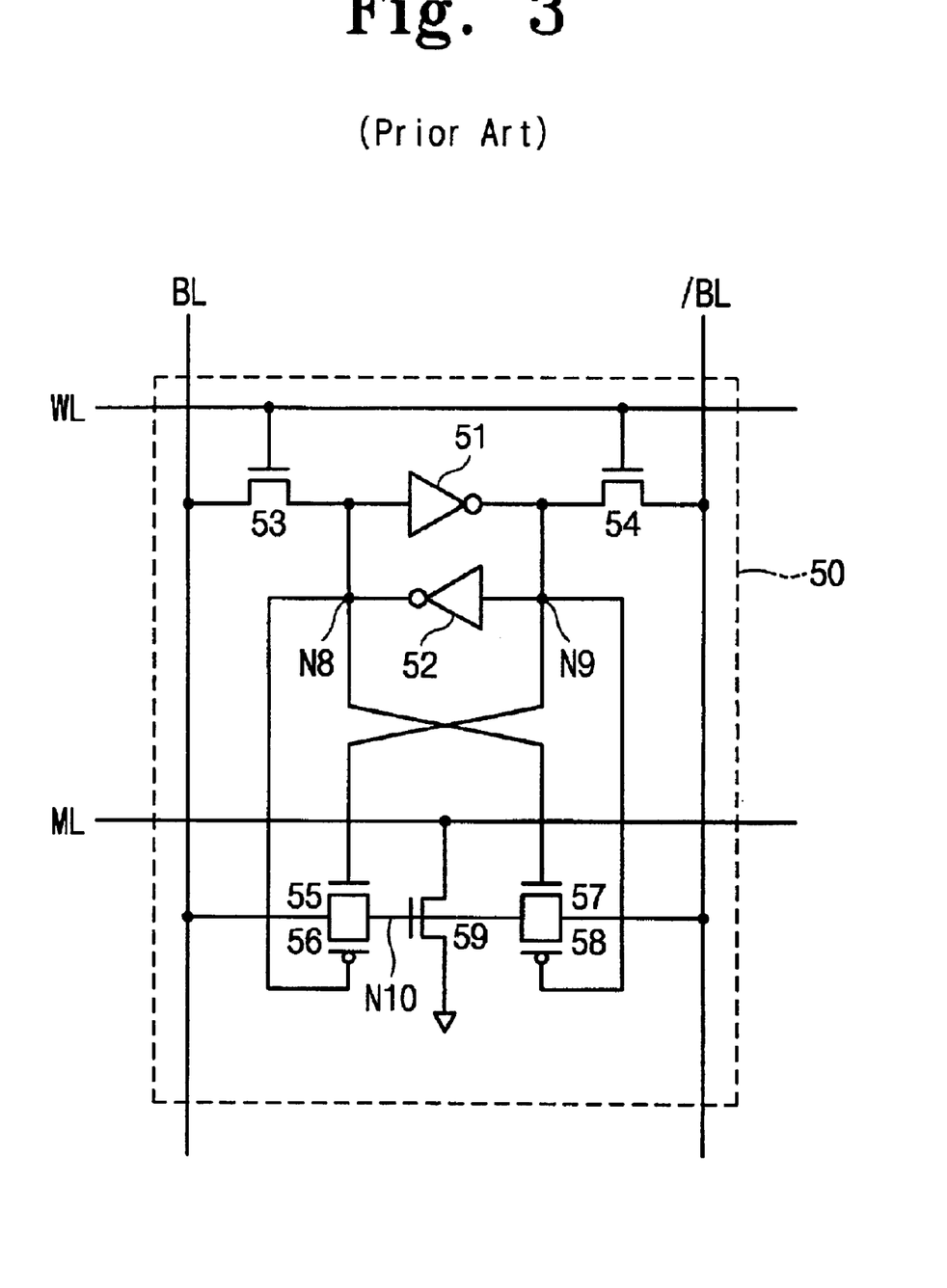

FIG. 3 illustrates another exemplary CAM cell 50 disclosed in the U.S. Pat. No. 5,490,102 entitled "Low capacitance content-addressable memory cell" issued in 1996 to Farah. The CAM cell 50 comprises a SRAM having inverters 51, 52 and NMOS transistors 53, 54, and a comparing circuit having NMOS transistors 55, 57 and PMOS transistors 56, 58. The transistors of the comparing circuit are arranged into two pass gates, for example, transistors 55 and 56 for receiving the data input through a bit line BL, and transistors 57 and 58 for receiving the data input through a bit line /BL.

If the data input through the bit lines BL, /BL are identical with the data stored in the SRAM cell, the level of node N10 becomes low, so that an NMOS transistor 59 is turned off and a match line ML maintains a pre-charged level. However, if the data inputted through the bit lines BL, /BL is different from the data stored in the SRAM cell, the level of node N10 becomes high to discharge the match line ML.

The CAM cell 50 operates at faster speed than the CAM cell 30 of FIG. 2 by using NMOS and PMOS transistors in a comparing circuit, but the CAM cell 50 has a low integration density since the PMOS transistor occupies a greater area. Further, since the transistors 55, 56, 57 and 58 are operated in response to the data stored in the SRAM, the CAM cell 50 consumes high power.

SUMMARY OF THE INVENTION

It is an object of the present invention to provide a content addressable memory that provides high integration density, with high operation speed and low power consumption.

According to one aspect of the present invention, a content addressable memory device comprises a memory cell connected between first and second nodes, first and second data lines for transmitting first and second data signals to the first and second nodes, respectively, and first and second switching devices serially connected between a match line and a reference voltage, wherein the first switching device is controlled by the first data signal and a voltage of the first node and the second switching device is controlled by the second data signal and a voltage of the second node. Preferably, one of the first and second switching devices is turned off when a voltage level of the first data signal is similar to a voltage level of the first data signal and a voltage level of the second node is similar to a voltage level of the second data signal. Both the first and second switching devices are turned on when the voltage level of the first data signal is different from the voltage level of the first data signal and the voltage level of the second node is different from the voltage level of the second data signal.

According to another aspect of the present invention, a content addressable memory device comprises a memory cell for latching in first and second data signals on first and second nodes from first and second data lines, respectively, a first switching device comprising a first terminal connected to a match line, a second terminal connected to a common node, and a third terminal connected to the first data line, a second switching device comprising a first terminal connected to the match line, a second terminal connected to the common node, and a third terminal connected to the first node, a third switching device comprising a first terminal connected to a reference voltage, a second terminal connected to the common node, and a third terminal connected to the second data line, and a fourth switching device comprising a first terminal connected to the reference voltage, a second terminal connected to the common node, and a third terminal connected to the second node. Preferably, the first, second, third and fourth switching devices comprise NMOS transistors. Preferably, the memory cell comprises a static random access memory cell (SRAM).

According to further aspect of the present invention, a content addressable memory device comprises a memory cell connected between first and second nodes, a first data line for transferring a first data signal to the first node, a second data line for transferring a second data signal to the second node, and a comparing circuit connected to the first and second nodes and a match line, wherein the comparing circuit compares voltage levels of the first and second data signals with voltage levels of the first and second nodes, respectively, and controls a voltage level of the match line based on the comparison result. Preferably, the comparing circuit comprises a first switching device comprising a first terminal connected to the match line, a second terminal connected to the first data line and a third terminal connected to the first node, and a second switching device comprising a first terminal connected to a reference voltage, a second terminal connected to the second data line and a third terminal connected to the second node, wherein the first and second switching devices are serially connected to each other and form a current path between the match line and the reference voltage.

These and other aspects, factors, and advantages of the present invention will become apparent from the following detailed description of preferred embodiments, which is to be read in conjunction with the accompanying figures.

DESCRIPTION OF PREFERRED EMBODIMENTS

The present invention will now be described more fully hereinafter with reference to the accompanying drawings, in which preferred embodiments of the invention are shown. This invention, however, may be embodied in different forms and should not be construed as limited to the embodiments set forth herein. Rather, these embodiments are provided so that this disclosure will be thorough and complete, and will fully convey the scope of the invention to those skilled in the art.

A content addressable memory (CAM) cell according to a preferred embodiment comprises a memory cell connected between first and second nodes, a first data line for transmitting a first data signal to the memory cell, a second data line for transmitting a second data signal to the memory cell, and first and second switching devices connected sequentially in series between a match line and a reference voltage. Advantageously, as demonstrated hereinafter, the CAM cell provides high integration density, high operation speed, and low power consumption as compared to conventional CAM cells.

Figure 4:
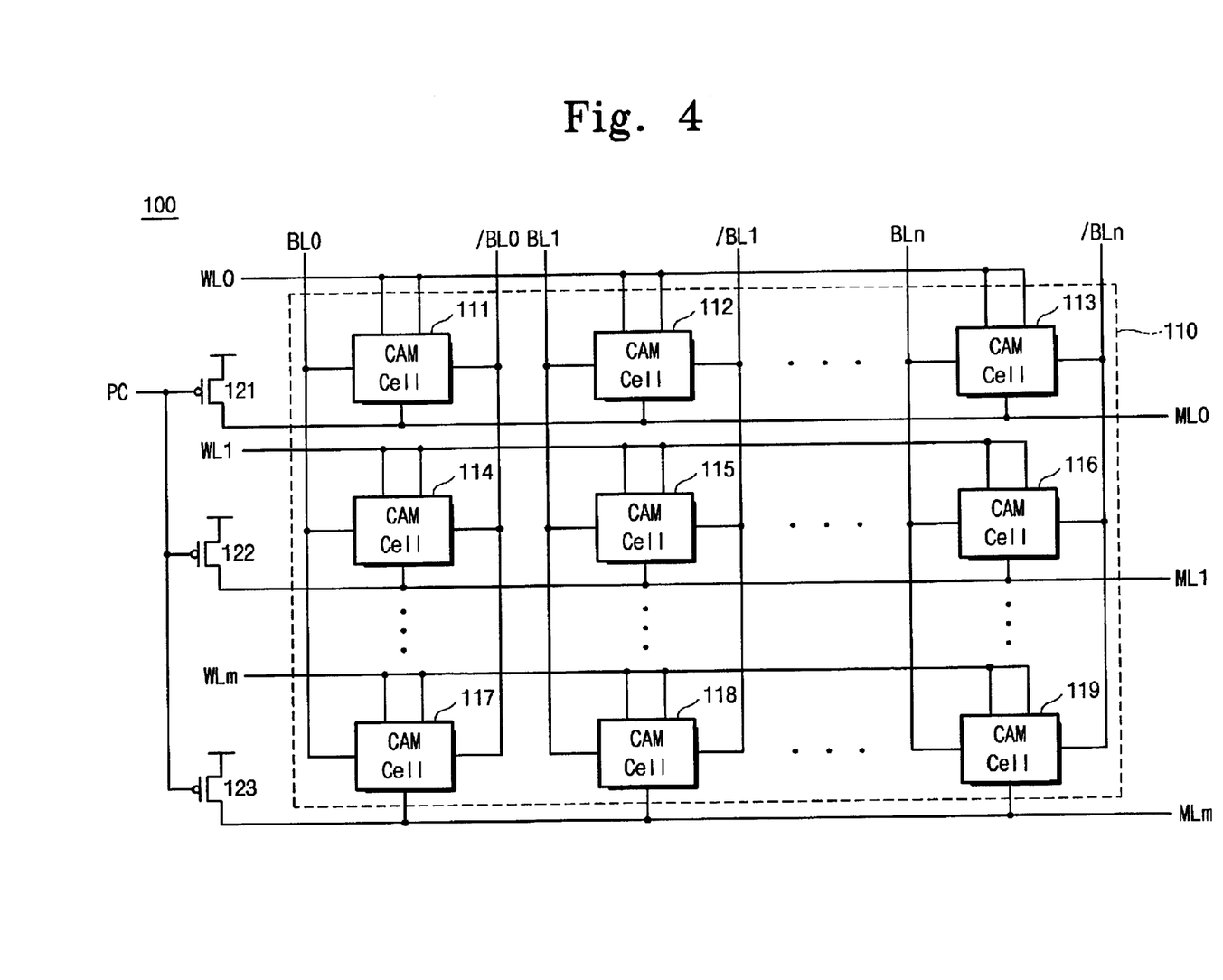
FIG. 4 is a diagram showing a content addressable memory comprising a CAM cell according to an embodiment of the present invention.

FIG. 4 illustrates a content addressable memory (CAM) cell according to an embodiment of the present invention. The CAM 100 comprises a CAM cell array 110 having a plurality of CAM cells 111~119, a plurality of paired bit lines, (BL0,/BL0)~(BLn,/BLn), word lines WL0~WLm, and match lines ML0~MLm.

Each of the word lines WL0~WLm is associated with a row of the CAM cell array 110. For example, word line WL0 is associated with the row having CAM cells 111~113. Likewise, word line WL1 is associated with the row having CAM cells 114~116, and a word line WLm is associated with the row having CAM cells 117~119.

Each of the bit line pairs (BL0,/BL0)~(BLn,/BLn) is provided to each column of the CAM cell array 110. For example, a bit line pair (BL0,/BL0) is connected to a column having CAM cells 111, 114 and 117. Likewise, a bit line pair (BL1,/BL1) is connected to a column having CAM cells 112, 115 and 118, and a bit line pair (BLn,/BLn) is connected to a column having CAM cells 113, 116, and 119.

The match lines ML0~NLm are connected to the CAM cells of corresponding rows of a CAM cell array 110, and connected to pre-charge transistors 121~123, respectively. A match line ML0 is connected to a row having CAM cells 111~113 and to a pre-charge transistor 121. Likewise, a match line ML1 is connected to a row having CAM cells 114~116 and to a pre-charge transistor 122, and a match line MLm is connected to a row having CAM cells 117~119 and to a pre-charge transistor 123.

If the data to be written is loaded on the bit line pairs (BL0,/BL0)~(BLn,/BLn), one of the word lines WL0~WLm is used to select one row of the CAM cell array 110 to write the data in the array 110 during a writing operation. The word lines WL0~WLm are activated only during a writing operation and are inactive during the other operation modes. During the writing operation, the pre-charge transistors 121~123 do not perform pre-charge operations.

During a comparing operation, each of CAM cells 111~119 detects the mismatch between the data stored therein and the data inputted through a bit line pair corresponding to the CAM cell, and discharges a corresponding match line out of match lines ML0~MLm. For example, if the data inputted through a bit line pair (BL0,/BL0) is mismatched with the data stored in a CAM cell 111, the CAM cell 111 discharges a match line ML0. That is, the transition of the level of the match line ML0 from high to low indicates that there is a mismatch between data in a row of the CAM cell array 110 corresponding to the match line ML0.

Figure 5:
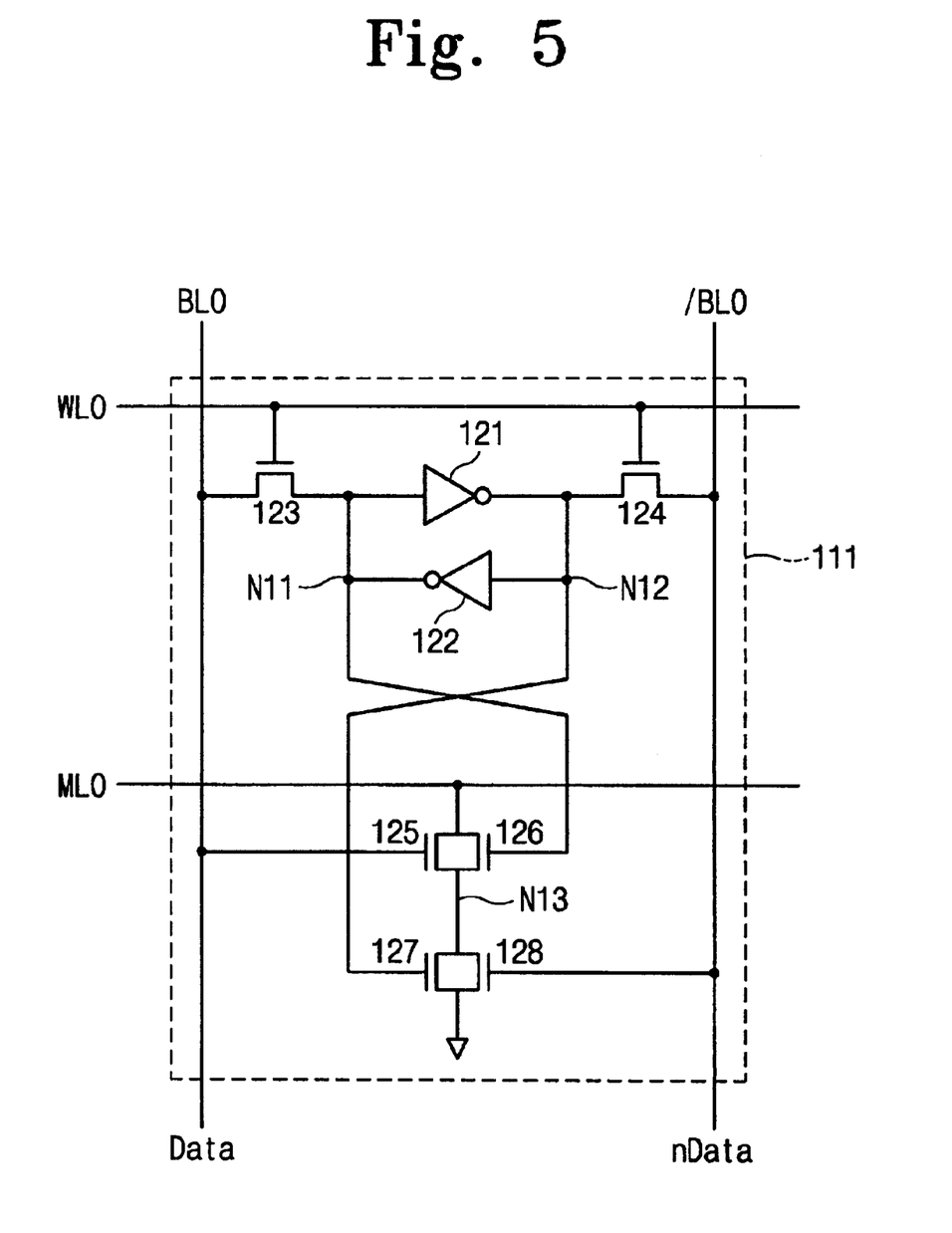
FIG. 5 is a diagram showing a detailed circuit configuration of a CAM cell according to an embodiment of the present invention.

FIG. 5 illustrates a detailed configuration of the CAM cell 111 of FIG. 4. The other CAM cells 112~119 have the same configuration as the CAM cell 111. The CAM cell 111 comprises a memory cell and a comparing circuit. The memory cell comprises inverters 121 and 122 and NMOS transistors 123 and 124.

The comparing circuit comprises a plurality of pass gates, one comprising NMOS transistors 125 and 126 and another pass gate comprising NMOS transistors 127 and 128. The pass gates are connected in series between the match line ML0 and ground voltage, and discharge a voltage level of the match line ML0. A gate of the NMOS transistor 125 is connected to the bit line BL0, a gate of the NMOS transistor 126 is connected to node N11, a gate of the NMOS transistor 127 is connected to node N12, and a gate of NMOS transistor 128 is connected to the bit line /BL0.

The CAM cell 111 receives the input data through the bit line pair (BL0,/BL0). Complementary data is loaded on the bit line pair (BL0,/BL0) during writing and comparing operations. For example, if the data loaded on the bit line BL0 is logic '0', data of logic '1' is loaded on the bit line /BL0. If the data loaded on the bit line BL0 is logic '1', the data of logic '0' is loaded on the bit line /BL0.

During a writing operation of the CAM cell 111, the complementary data to be written is loaded on the bit line pair (BL0,/BL0), and the word line WL0 is activated to a high level voltage. The NMOS transistors 123, 124 are turned on in response to the high level voltage of the word line WL0. If the high level voltage (i.e., the data of logic '1') is applied to the bit line BL0 and a low level voltage (i.e., the data of logic '0') is applied to the bit line /BL0, the transistor 123 transfers the high level voltage of the bit line BL0 to node N11, and the transistor 124 transfers the low level voltage of the bit line /BL0 to node N12. Thus, the high level voltage and the low level voltage are stored in nodes N11, N12 through the inverters 121, 122, respectively.

During a comparing operation of the CAM cell 111, the data to be compared is loaded on the bit line pair (BL0,/BL0). The word line WL0 maintains a low level voltage during the comparing operation. If the data loaded on the bit line pair (BL0,/BL0) is identical with the data of nodes N11, N12 in the CAM cell 110, one of the pass gates, i.e., the transistors 125 and 126 or the transistors 127 and 128, is switched off so that the match line ML0 maintains a pre-charged voltage level.

If the data loaded on a bit line pair (BL0,/BL0) is different from the data on nodes N11, N12 of the CAM cell 111, one of the transistors 125, 126 is turned on and the other of them is turned off, and one of the transistors 127, 128 is turned on and the other of them is turned off to discharge the match line ML0. For example, when nodes N11 and N12 of the CAM cell 111 store high and low level voltages, respectively, and the pair of bit lines (BL0,/BL0) receives low and high level voltages, respectively, the transistors 125, 127 are turned off and the transistors 126, 128 are turned on. Thus, a current path is formed between the match line ML0 and the ground voltage to discharge the match line ML0.

If a high level voltage is applied to both the bit lines (BL0,/BL0), the current path is formed between the match line ML0 and the ground voltage regardless of a value stored in nodes N11, N12 of the CAM cell 111, thereby discharging the match line ML0. This may be useful for initializing the match line ML0. On the contrary, if a low level voltage is applied to both the bit lines (BL0,/BL0), the current path between the match line ML0 and the ground voltage is cut off, and a voltage level of the match line ML0 is not changed. This may be useful for maintaining the voltage level of the match line ML0.

Figure 6:
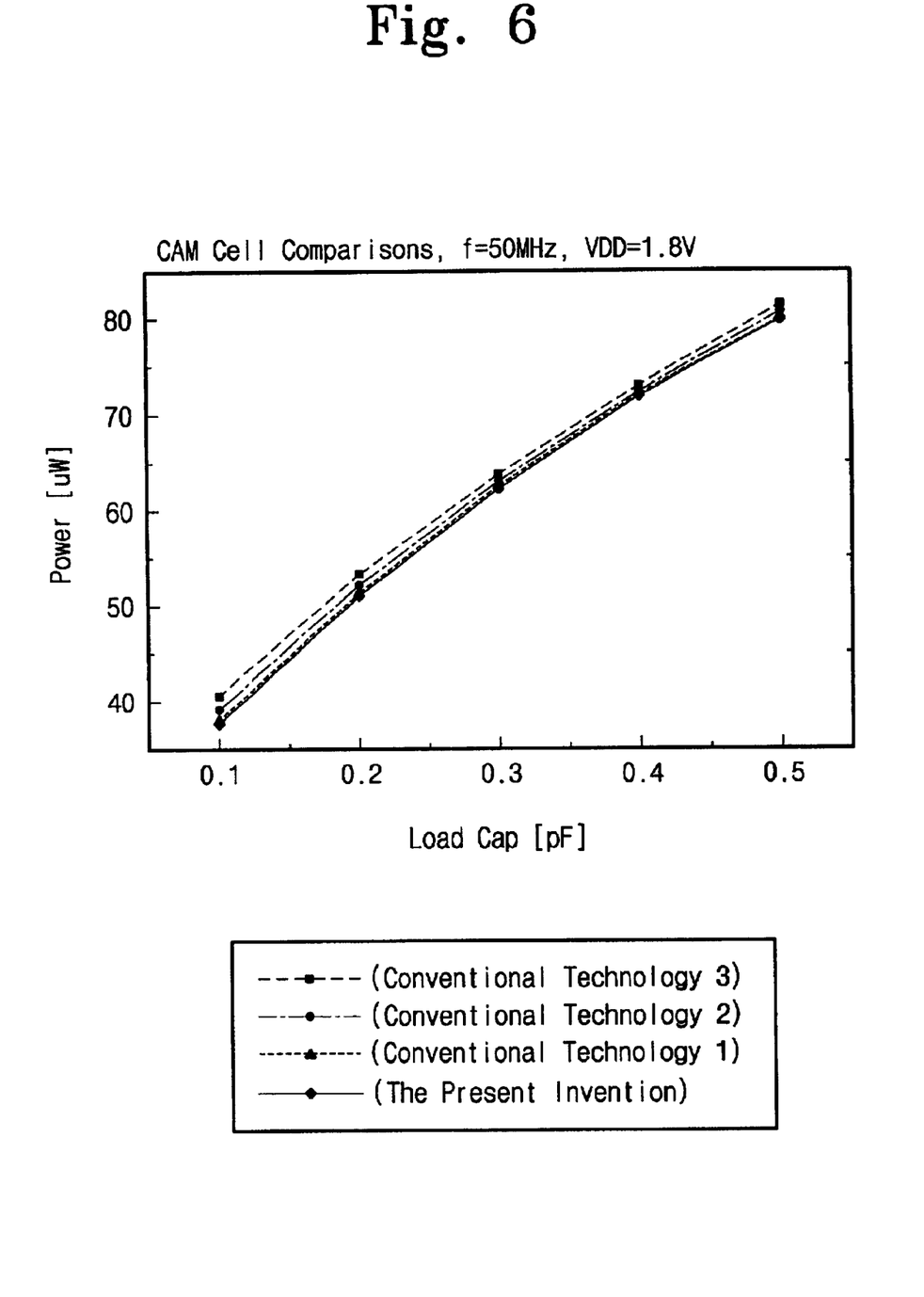
FIG. 6 is a graph showing power consumption of a CAM cell according to an embodiment of the present invention and the conventional CAM cells of FIGS. 1~3.

FIG. 6 is a graph illustrating a comparison result of the CAM cell of FIG. 5 and the CAM cells of FIGS. 1–3 with respect to power consumption. The CAM cells 10, 30, 50, and 111 were prepared with the same CMOS process having the same line width of 0.18 $\mu$m, and a capacitor was connected between a ground voltage and a match line of each CAM cell 10, 30, 50 and 111. Power consumption was measured on each CAM cell 10, 30, 50 and 111 by using the capacitance of the capacitor.

As shown in FIG. 6, when a power source voltage VDD is 1.8V and a frequency $f$ of an input signal is 50 MHz, the power consumption of the CAM cell 111 is lower than the power consumption of the conventional CAM cells 10, 30, and 50.

Figure 7:
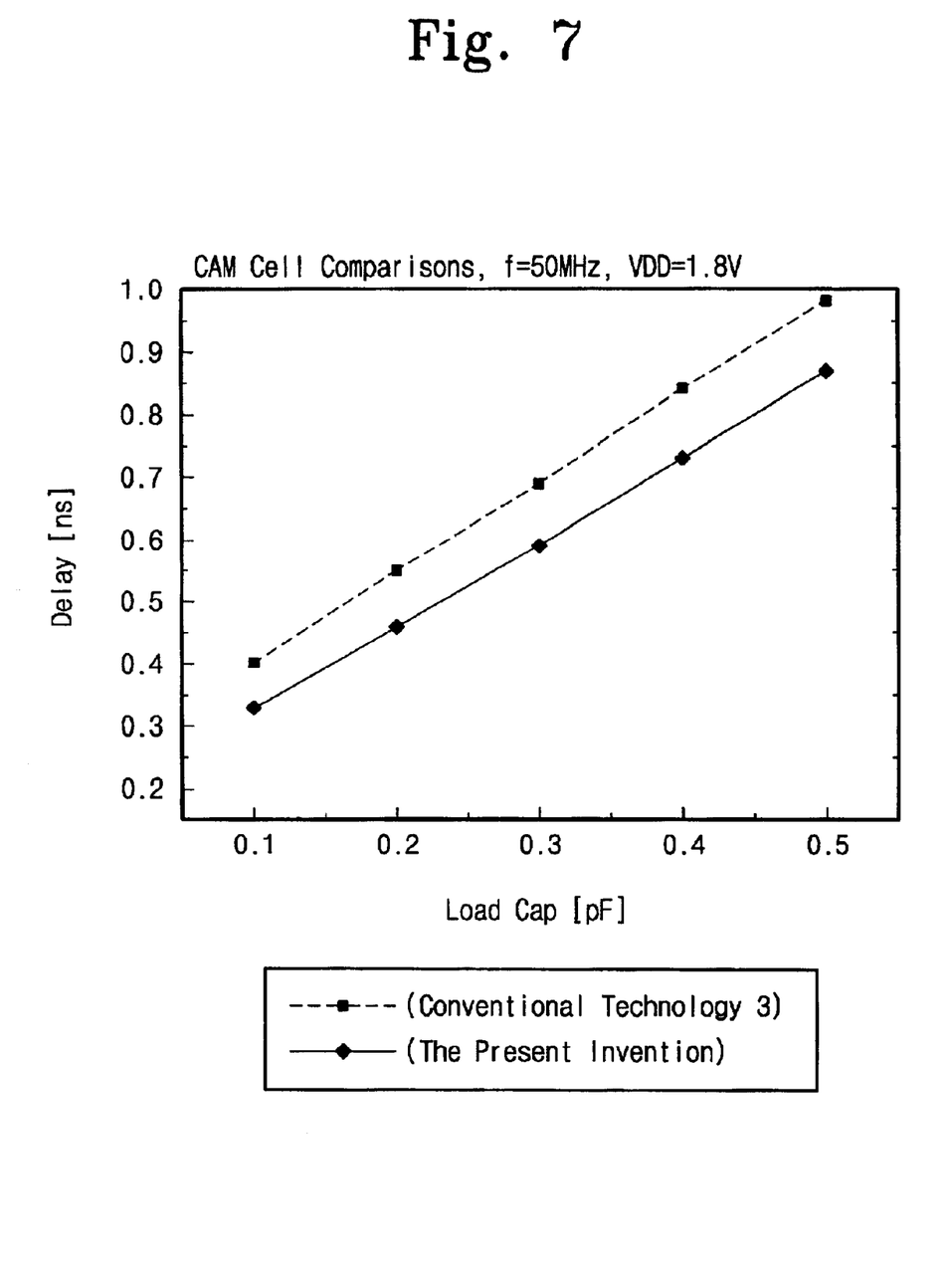
FIG. 7 is a graph showing delay time of a conventional CAM cell and a CAM cell according to an embodiment of the present invention.

FIG. 7 is a graph showing a comparison result of the CAM cell 50 of FIG. 3 and the CAM cell 111 of FIG. 5 with respect to delay time, assumed that the CAM cell 111 has the same area with the CAM cell 50 of FIG. 3. The delay time indicates the time for discharging a match line after applying a predetermined signal to a pair of bit lines and a word line.

As shown in FIG. 7, the CAM cell 111 of FIG. 5 shows faster operation speed than the CAM cell 50 of FIG. 3 by 11~18%. Further, since the CAM cell 111 of FIG. 5 may operate at higher speed without a PMOS transistor (that is used in the CAM cell of FIG. 3) occupying a greater circuit area, the CAM cell 111 may be reduce a circuit area in comparison with the CAM cell 50.

Advantageously, a CAM cell according to an embodiment of the present invention provides lower power consumption, a higher integration density, and higher operation speed, in comparison with conventional CAM cells.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A content addressable memory device, comprising:
   a memory cell connected between first and second nodes;
   first and second data lines for transmitting first and second data signals to the first and second nodes, respectively; and
   first and second switching devices serially connected between a match line and a reference voltage, wherein the first switching device is controlled by the first data signal and a voltage of the first node and the second switching device is controlled by the second data signal and a voltage of the second node, wherein one of the first and second switching devices is turned off when the voltage level of the first node is similar to a voltage level of the first data signal and the voltage level of the second node is similar to a voltage level of the second data signal.

2. The device of claim 1, wherein both the first and second switching devices are turned on when the voltage level of the first node is different from a voltage level of the first data signal and the voltage level of the second node is different from a voltage level of the second data signal.

3. The device of claim 1, wherein the first switching device comprises:

a first transistor comprising a first terminal connected to the match line, a second terminal connected to the second switching device, and a third terminal connected to the first data line; and a second transistor comprising a first terminal connected to the match line, a second terminal connected to the second switching device, and a third terminal connected to the first node.

4. The device of claim 3, wherein the first and second transistors comprise NMOS transistors.

5. The device of claim 3, wherein the second switching device comprises:

a third transistor comprising a first terminal connected to the first switching device, a second terminal connected to the reference voltage, and a third terminal connected to the second node; and a fourth transistor comprising a first terminal connected to the first switching device, a second terminal connected to the reference voltage, and a third terminal connected to the second data line.

6. The device of claim 5, wherein the third and fourth transistors comprise NMOS transistors.

7. The device of claim 1, wherein the reference voltage is a ground voltage.

8. The device of claim 1, wherein the memory cell comprises:

a fifth transistor comprising a first terminal connected to the first data line, a second terminal connected to the first node, and a third terminal connected to an address line;

a sixth transistor comprising a first terminal connected to the second data line, a second terminal connected to the second node, and a third terminal connected to the address line; and wherein the memory cell comprises:

a first inverter comprising an input terminal connected to the first node and an output terminal connected to the second node; and a second inverter comprising an input terminal connected to the second node and an output terminal connected to the first node.

9. The device of claim 1, wherein the memory cell comprises a static random access memory (SRAM) cell.

10. A content addressable memory device, comprising:

a memory cell for latching in first and second data signals on first and second nodes from first and second data lines, respectively;

a first switching device comprising a first terminal connected to a match line, a second terminal connected to a common node, and a third terminal connected to the first data line;

a second switching device comprising a first terminal connected to the match line, a second terminal connected to the common node, and a third terminal connected to the first node;

a third switching device comprising a first terminal connected to a reference voltage, a second terminal connected to the common node, and a third terminal connected to the second data line; and a fourth switching device comprising a first terminal connected to the reference voltage, a second terminal connected to the common node, and a third terminal connected to the second node.

11. The device of claim 10, wherein the first, second, third, and fourth switching devices comprise NMOS transistors.

12. The device of claim 10, wherein the reference voltage is a ground voltage.

13. The device of claim 10, wherein the memory cell comprises a static random access memory (SRAM) cell.

14. A content addressable memory device, comprising:

a memory cell connected between first and second nodes;

a first data line for transferring a first data signal to the first node;

a second data line for transferring a second data signal to the second node; and a comparing circuit connected to the first and second nodes and a match line, wherein the comparing circuit compares voltage levels of the first and second data signals with voltage levels of the first and second nodes, respectively, and controls a voltage level of the match line based on the comparison result.

15. The device of claim 14, wherein the comparing circuit comprises:

a first switching device comprising a first terminal connected to the match line, a second terminal connected to the first data line and a third terminal connected to the first node; and a second switching device comprising a first terminal connected to a reference voltage, a second terminal connected to the second data line and a third terminal connected to the second node, wherein the first and second switching devices are serially connected to each other and form a current path between the match line and the reference voltage.

16. The device of claim 15, wherein one of the first and second switching devices is turned off such that the match line is disconnected from the reference voltage, when a voltage level of the first node is similar to a voltage level of the first data signal and a voltage level of the second node is similar to a voltage level of the second data signal.

17. The device of claim 15, wherein both the first and second switching devices are turned on such that the match line is connected to the reference voltage, when a voltage level of the first node is different from the first data signal and a voltage level of the second node is different from the second data signal.

18. The device of claim 15, wherein the first and second switching devices each comprise a pair of NMOS transistors.

19. The device of claim 15, wherein the reference voltage is a ground voltage.

20. The device of claim 15, wherein the memory cell comprises a static random access memory (SRAM) cell.

* * * * *